(12) United States Patent
Sakurai et al.

(10) Patent No.: US 8,501,560 B2
(45) Date of Patent: Aug. 6, 2013

(54) METHOD FOR MANUFACTURING THIN FILM CAPACITOR AND THIN FILM CAPACITOR OBTAINED BY THE SAME

(75) Inventors: Hideaki Sakurai, Takai-mura (JP); Toshiaki Watanabe, Sanda (JP); Nobuyuki Soyama, Kobe (JP); Guillaume Guegan, Tours (FR)

(73) Assignees: Mitusbishi Materials Corporation, Tokyo (JP); STMicroelectronics(Tours) SAS, Tours (FR)

( * ) Notice: Subject to any disclaimer, the term of this patent is extended or adjusted under 35 U.S.C. 154(b) by 0 days.

(21) Appl. No.: 13/067,800

(22) Filed: Jun. 28, 2011

(65) Prior Publication Data

US 2012/0001298 A1 Jan. 5, 2012

(30) Foreign Application Priority Data

Jul. 1, 2010 (EP) .................................... 10305716

(51) Int. Cl.
*H01L 21/8242* (2006.01)
*H01L 21/00* (2006.01)
*H01L 21/20* (2006.01)

(52) U.S. Cl.
USPC ............. 438/240; 438/3; 438/239; 438/396; 438/381

(58) Field of Classification Search
USPC ................. 257/532; 438/171, 190, 210, 238, 438/329, 239, 3, 240, 244, 250, 253, 379, 438/381, 393, 396
See application file for complete search history.

(56) References Cited

U.S. PATENT DOCUMENTS

| | | | |
|---|---|---|---|
| 5,516,363 A | 5/1996 | Azuma et al. | |
| 5,624,707 A | 4/1997 | Azuma et al. | |
| 5,909,042 A | 6/1999 | Azuma et al. | |
| 6,133,050 A * | 10/2000 | Azuma et al. | ...... 438/3 |
| 6,454,964 B1 * | 9/2002 | Scott et al. | ...... 252/182.12 |

(Continued)

FOREIGN PATENT DOCUMENTS

| | | |
|---|---|---|
| JP | 60-236404 A | 11/1985 |
| JP | 3129175 B2 | 6/1997 |
| JP | 3146961 B2 | 6/1997 |
| JP | 2008-227115 A | 9/2008 |

OTHER PUBLICATIONS

European Search Report issued Dec. 13, 2010 in connection with European Application No. 10305716.2.

(Continued)

*Primary Examiner* — Chuong A. Luu
(74) *Attorney, Agent, or Firm* — Edwards Wildman Palmer LLP

(57) ABSTRACT

A thin film capacitor is characterized by forming a lower electrode, coating a composition onto the lower electrode without applying an annealing process having a temperature of greater than 300° C., drying at a predetermined temperature within a range from ambient temperature to 500° C., and calcining at a predetermined temperature within a range of 500 to 800° C. and higher than a drying temperature. The process from coating to calcining is performed the process from coating to calcining once or at least twice, or the process from coating to drying is performed at least twice, and then calcining is performed once. The thickness of the dielectric thin film formed after the first calcining is 20 to 600 nm. The ratio of the thickness of the lower electrode and the thickness of the dielectric thin film formed after the initial calcining step (thickness of lower electrode/thickness of the dielectric thin film) is preferably in the range 0.10 to 15.0.

6 Claims, 1 Drawing Sheet

U.S. PATENT DOCUMENTS

| | | | |
|---|---|---|---|
| 2001/0032992 A1 | 10/2001 | Wendt | |
| 2002/0117700 A1 | 8/2002 | Fox | |
| 2005/0006685 A1 | 1/2005 | Natsume et al. | |
| 2005/0079670 A1* | 4/2005 | Takeshima et al. | 438/250 |
| 2005/0111162 A1 | 5/2005 | Osaka et al. | |

OTHER PUBLICATIONS

Office Action issued Jul. 9, 2012 in connection with European Application No. 10305716.2.

* cited by examiner

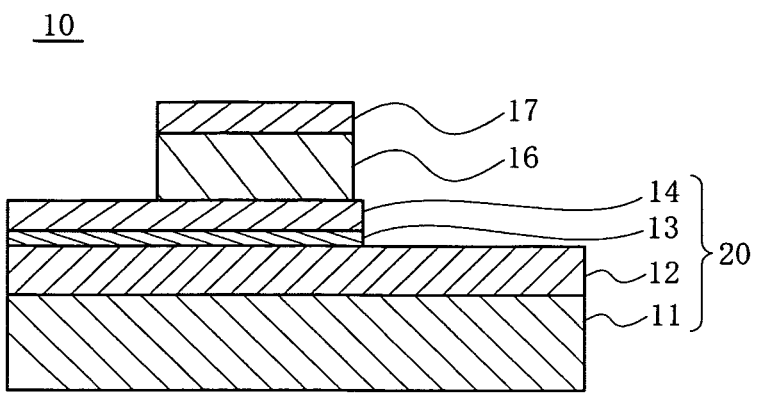

METHOD FOR MANUFACTURING THIN FILM CAPACITOR AND THIN FILM CAPACITOR OBTAINED BY THE SAME

BACKGROUND OF THE INVENTION

1. Field of the Invention

The present invention relates to a method for manufacturing a thin film capacitor having superior leakage current characteristics and dielectric breakdown voltage characteristics. More particularly, the present invention relates to a method for manufacturing a thin film capacitor having the superior characteristics above in which formation of hillocks is suppressed during the manufacturing process of the thin film capacitor and which thereby prevents deterioration in dielectric breakdown voltage and increase in leakage current density caused by hillock generation.

2. Description of Related Art

Electronic devices such as a dynamic random access memory (DRAM), a ferroelectric random access memory (FeRAM), an RF circuit or the like are provided with a capacitor. However the demand for higher integration and miniaturizing of devices in recent years has resulted in a corresponding reduction in the area occupied by the capacitor in a device. A capacitor has a basic structure which includes an upper electrode, a lower electrode and a dielectric layer sandwiched between the electrodes. The capacitance of a capacitor is proportional to the surface area of the electrode and the dielectric constant of the dielectric layer and, on the other hand, is inversely proportional to the distance between the electrodes, that is to say, the thickness of the dielectric layer or the like. Since there is a limit on the thickness of the dielectric layer, a dielectric material with a higher dielectric constant must be used in the dielectric layer in order to conserve a high capacitance in the limited occupied area.

For that reason, in contrast to conventional materials with a low dielectric constant including $SiO_2$, $Si_3N_4$ or the like, attention has focused on dielectric thin films formed from perovskite oxides including strontium titanate ("$SrTiO_3$"), barium strontium titanate (hereafter referred to as "BST"), lead zirconate titanate (hereafter referred to as "PZT") and the like. Furthermore a method of forming a dielectric thin film includes a chemical solution method such as a sol-gel method and the like (for example, see Japanese Unexamined Patent Application, First Publication No. S60-236404 (page 6, right upper column, line 10 to left lower column, line 3)) in addition to physical vapor deposition methods such as vacuum deposition methods, sputtering methods, laser ablation methods and the like, and chemical vapor deposition methods such as metal organic chemical vapor deposition (MOCVD) and the like. In particular, sol-gel methods have the advantage of facilitating formation on a large surface area of the substrate at a low manufacturing cost due to the lack of a requirement for a vacuum process in contrast to CVD methods, sputtering methods and the like. Moreover since modification of the components of the composition used in formation of the dielectric thin film facilitates the enablement of a theoretical ratio in the composition in the film in addition to obtaining an extremely thin dielectric thin film, it is expected to provide a mass-production method for formation of a thin film capacitor.

However in this area of thin film capacitors, there are outstanding issues regarding problems such as deterioration in dielectric breakdown voltage characteristics and leakage current characteristics which are thought to result from high-temperature calcining during the manufacturing process. For example, a thin film capacitor is manufactured by a general manufacturing process as described hereafter. Firstly, an adhesion layer is formed on a substrate which has an insulation film such as a $SiO_2$ film or the like. Then a lower electrode is formed using a starting material such as a noble metal such a Pt or the like on the adhesion layer. Thereafter a composition for use in thin film formation is coated and dried on the resulting lower electrode. After the coating is formed, a dielectric thin film is formed by calcining and crystallization of the substrate which has the coating, and an upper electrode is formed on the resulting dielectric thin film.

In the above manufacturing process, in particular, the calcining temperature for crystallization during the deposition process of the dielectric thin film reaches a temperature of more than 800° C. As a result, the dielectric thin film undergoes minute cracking or bubbling due to deterioration of the lower electrode or rapid contraction of the film caused by the high-temperature calcining and, as a result, deterioration in dielectric breakdown voltage characteristics and leakage current characteristics result. In order to avoid these types of disadvantages which are associated with high-temperature calcining, a technique has been disclosed which deposits a dielectric thin film using a lower calcining temperature than conventional techniques (for example, see Japanese Patent Publication No. 3146961 (claim 1, claim 3 and paragraph [0015]) and Japanese Patent Publication No. 3129175 (claim 1, claim 2 and paragraph [0017]). These techniques execute deposition using a lower temperature of approximately 450° C. to 800° C. by adding a Si component in a predetermined ratio in addition to principal components such as Ba, Sr, Ti and the like to the composition used for thin film formation.

Application of the above type of high-temperature heat process includes further disadvantages such as the production of semispherical protrusions of approximately the same size as the thickness of the lower electrode which are termed "hillocks" on the interface between the dielectric thin film and the lower electrode (on the lower electrode side). These hillocks cause deterioration in dielectric breakdown voltage characteristics and leakage current characteristics in the same manner as cracking or bubbles produced in the dielectric thin film. When a hillock is produced, the film thickness of the dielectric thin film at that position is extremely thin in comparison to other portions and therefore the film thickness of the dielectric thin film lacks uniformity. Consequently leakage current also increases between the upper electrode and the lower electrode when forming a capacitor and dielectric breakdown voltage also deteriorates.

However in a manufacturing process for a thin film capacitor, in addition to calcining to crystallize the coating, the adhesion characteristics between the adhesion layer and the lower electrode are improved by an annealing process using a predetermined temperature which is applied during the formation of the adhesion layer or after forming the lower electrode and prior to coating of the composition for forming the thin film (for example, see Japanese Unexamined Patent Application, First Publication No. 2008-227115 (paragraph [0024], paragraph [0027]).

SUMMARY OF THE INVENTION

The technique disclosed in the Japanese Patent Publication No. 3146961 (claim 1, claim 3 and paragraph [0015]) and the Japanese Patent Publication No. 3129175 (claim 1, claim 2 and paragraph [0017]) teaches an improvement in the material used when manufacturing a thin film capacitor. In other words, the improvement in the material enables formation of a dielectric thin film at a lower calcining temperature than the conventional technique and suppresses deterioration in the dielectric breakdown voltage characteristics and leakage current characteristics caused by cracking or bubbling resulting from a conventional high-temperature calcining process.

Furthermore since it is clear that hillock generation is facilitated by higher calcining temperatures during the deposition process of the dielectric thin film, there is some expectation that hillocks can be suppressed if dielectric thin film formation is enabled at low-temperature calcining. The present inventors completed the present invention based on the insight that there is the possibility that the cause of hillock generation is not only the deposition process for the dielectric thin film and may also result from another process such as an annealing process performed after the formation of the lower electrode as described above.

It is therefore an object of the present invention to provide a method for manufacturing a thin film capacitor having superior leakage current characteristics and dielectric breakdown voltage characteristics by also removing the cause of hillock generation in processes other than the deposition process for the dielectric thin film and which suppresses hillocks by controlling conditions during such processes.

It is a further purpose of the present invention to provide a thin film capacitor having superior leakage current characteristics and dielectric breakdown voltage characteristics and low generation of hillocks, and an electronic device provided with the thin film capacitor.

According to a first aspect of the present invention, a method for manufacturing a thin film capacitor includes the steps of:

forming an insulation film on a substrate; laminating an adhesion layer onto the insulation film;

forming a lower electrode on the adhesion layer;

dissolving an organic barium compound, an organic strontium compound and a titanium alkoxide in an organic solvent to achieve a molar ratio of Ba:Sr:Ti=1−x:x:y, coating the resulting thin film formation $Ba_{1-x}Sr_xTi_yO_3$ composition onto a lower electrode and drying to thereby form a coating;

forming a dielectric thin film by calcining the substrate with the coating formed thereon; and forming an upper electrode on the dielectric thin film, wherein the composition is coated onto the lower electrode without performing an annealing process at a temperature higher than 300° C. after forming the lower electrode;

the drying temperature is within a range from ambient temperature to 500° C.;

the calcining temperature is within a range of 500 to 800° C. and higher than the drying temperature;

the process from coating to calcining is such that the process from coating to calcining is performed at least once, or the process from coating to drying is performed at least twice, and then calcining is performed once; and the thickness of the dielectric thin film formed after the first calcining is 20 to 600 nm.

According to a second aspect of the present invention, the present invention according to the first aspect is characterized in that the ratio of the thickness of the lower electrode and the thickness of the dielectric thin film formed after the initial calcining step (thickness of lower electrode/thickness of the dielectric thin film) is in the range 0.10 to 15.0.

According to a third aspect of the present invention, a supporting body is provided for use in the manufacturing method according to the first or the second aspect. The supporting body includes a substrate, an insulation film formed on the substrate, and a lower electrode formed through an adhesion layer on the insulating film, wherein, an average crystal grain size in the lower electrode is 100 nm or less, the lower electrode has a preferred crystal orientation to the (111) face, (001) face or the (110) face, a residual stress of the lower electrode is −2000 to −100 MPa, and a lower electrode thickness is 50 to 600 nm.

A fourth aspect of the present invention is an electronic device includes a thin film capacitor obtained using the method for manufacturing according to the first or the second aspect.

In the method for manufacturing according to the first aspect of the present invention, a composition is coated onto a lower electrode without applying an annealing process having a temperature of greater than 300° C. after forming a lower electrode, drying is performed at a predetermined within a range from ambient temperature to 500° C. and calcining is performed at a predetermined temperature within a range of 500 to 800° C. and higher than the drying temperature. The process from coating to calcining performs the process from coating to calcining once or at least twice, or the process from coating to drying is performed at least twice, and then calcining is performed once. The thickness of the dielectric thin film formed after the first calcining is 20 to 600 nm. In this manner, it is possible to manufacture a thin film capacitor in which the generation of hillocks is suppressed and which has superior leakage current characteristics and dielectric breakdown voltage characteristics.

The supporting body according to the third aspect of the present invention has an average crystal grain size in the lower electrode of 100 nm or less, has a preferred crystal orientation in the crystal to the (111) face, (001) face or the (110) face, has a residual stress in the lower electrode of −2000 to −100 MPa, and has a lower electrode thickness of 50 to 600 nm. Therefore the supporting body is adapted for use in the method for manufacture according to the first aspect or the second aspect of the present invention.

The electronic device according to the fourth aspect is a device having an improved product life-time due to provision of a thin film capacitor having superior leakage current characteristics and dielectric breakdown voltage characteristics obtained by the method for manufacturing according to the present invention.

BRIEF DESCRIPTION OF THE DRAWINGS

FIG. 1 is a sectional view of a thin film capacitor according to an embodiment of the present invention.

DETAILED DESCRIPTION OF THE INVENTION

The aspects for carrying out the present invention will be described hereafter making reference to the attached figures.

In a method for manufacture of a thin film capacitor according to the present invention, firstly as shown in FIG. 1, an insulation film 12 is formed on a substrate 11. The substrate 11 includes a Si substrate and the like and the insulation film 12 for example is a thermally-oxidized film ($SiO_2$) or the like formed by application of a dry oxidation or wet oxidation in an oxidizing gas atmosphere to the Si substrate surface.

Then an adhesion layer 13 is laminated onto the insulation film 12. The adhesion layer 13 may be formed from a metallic thin film having high oxygen affinity such as Ti, Ta or the like, or an oxide thereof. Normally the adhesion layer 13 includes a deposit of a thin metallic film of Ti or the like using a sputtering method or the like and then a thermal process is applied for 1 to 60 minutes at a temperature of 600 to 800° C. in order to increase adhesiveness and thereby create a metallic oxide. The thickness of the adhesion layer 13 is preferably in the range of 10 to 50 nm. There is no particular need to provide the adhesion layer 13 if the adhesiveness of the lower electrode 14 to the next lower layer is sufficient.

Next a lower electrode 14 is formed on the adhesion layer 13. The formation of the lower electrode 14 preferably employs a noble metal material such as Pt, Ru or Ir or the like which are resistant to oxidation reactions during the thermal processing and may be formed using various methods including vapor deposition methods such as vacuum deposition methods, sputtering methods and the like, screen printing methods using an electrode paste, spray methods, droplet ejection methods or the like. In the method for manufacturing according to the present invention, a sputtering method is preferred since superior surface smoothness is obtained after deposition. The lower electrode 14 takes different thickness values depending of the device type which mounts the capacitor and is preferably 50 to 600 nm. When the thickness values of the lower electrode 14 is less than the lower limiting value, the film is discontinuous. When the thickness values of the lower electrode 14 exceeds the upper limiting value, it is not preferred due to material costs considerations.

A supporting body 20 obtained by the above process includes a substrate 11 obtained by the above processes, an insulation film 12 formed on the substrate 11 and a lower electrode 14 formed via an adhesion layer 13 on the insulation film 12. More specifically, the supporting body 20 includes a laminated structure of Pt/Ti/SiO$_2$/Si, Pt/TiO$_2$/SiO$_2$/Si, Pt/IrO/Ir/SiO$_2$/Si, Pt/Ti N/SiO$_2$/Si, Pt/Ta/SiO$_2$/Si, and Pt/Ir/SiO$_2$/Si. In a method for manufacture of a thin film capacitor according to the present invention, the supporting body 20 preferably has an average crystal grain size in the lower electrode 14 of 100 nm or less to thereby obtain superior surface smoothness in the lower electrode 14. In the specification of the present invention, the average crystal grain size is observed using a scanning electron microscope (SEM) and is a measured value. Furthermore it is preferred that the lower electrode 14 has crystal orientation in a preferred orientation to the (111) face, (001) face or the (110) face. The crystal orientation enables a preferred orientation onto a desired face by optimizing deposition conditions including deposition temperature, deposition speed and the like. Residual stress in the lower electrode 14 is preferably −2000 to −100 MPa in order to suppress hillock generation. The residual stress in the lower electrode 14 can be adjusted within the above range by optimizing deposition conditions in a similar manner to crystal orientation.

Then coating of a thin film formation composition is performed after formation of the lower electrode 14. In the method for manufacture according to the present invention, after formation of the lower electrode 14, the thin film formation composition is coated onto the lower electrode 14 without performing an annealing process at a temperature higher than 300° C. Normally after formation of the lower electrode 14, as described above, an annealing process is performed at a predetermined temperature in order to reduce residual stress in the lower electrode 14 for the purpose of suppressing cracking generated during calcining to form a dielectric thin film 16 as described hereafter, or for the purpose of improving adhesiveness between the adhesion layer 13 and the lower electrode 14. However, in such an annealing process, since the surface of the lower electrode 14 is exposed and has not an effect of pressing from above, it is therefore considered to be a cause of promoting hillock generation. Consequently, the present invention suppresses hillock generation by a method of combining the annealing process during calcining in the deposition processing for the dielectric thin film 16 as described hereafter. The processing temperature during an annealing process which promotes hillock generation is a temperature higher than 300° C.

The thin film formation composition includes a Ba$_{1-x}$Sr$_x$Ti$_y$O$_3$ thin film formation composition prepared by dissolving an organic barium compound, an organic strontium compound and a titanium alkoxide in an organic solvent to achieve a molar ratio of Ba:Sr:Ti=1−x:x:y. In order to achieve a high dielectric constant, the x and y value, are preferably in the range 0.2<x<0.6, and 0.9<y<1.1. The organic barium/strontium compound is generally a metallic salt of carboxylic acid expressed by C$_n$H$_{2n+1}$COOH (wherein 3≦n≦7) and is preferably a carboxylate having a structure as shown in Formula (1) below. In Formula (1), R$_1$ to R$_6$ is hydrogen, a methyl group or an ethyl group, and M is Ba or Sr.

[Chemical Formula 1]

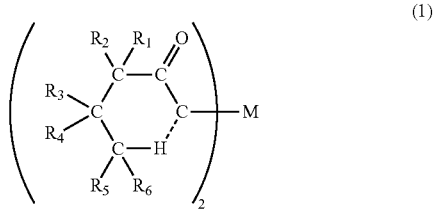

(1)

The coating of the thin film formation composition preferably uses a conventional coating method such as a spin coating method, a dip coating method or a spray coating method. However in view of facilitating adjustment of film thickness, a spin coating method is particularly preferred.

After coating the thin film formation composition onto the lower electrode 14, drying is performed to thereby form a coating. Then a dielectric thin film 16 is formed by calcining the substrate 11 having the coating formed thereon. The drying process is performed at a predetermined temperature in a range of ambient temperature to 500° C. in an atmosphere of air. When the predetermined temperature during drying exceeds the upper limiting value, defects result on the density of the coating. Calcining is performed at a predetermined temperature in a range of 500 to 800° C. which is higher than the drying temperature. When the calcining temperature is less than the lower limiting value, crystallization of the formed dielectric thin film 16 is insufficient. Conversely, when the calcining temperature exceeds an upper limiting value, the disadvantage occurs that the electrode is adversely affected. A preferred calcining temperature is a predetermined temperature in a range of 550 to 750° C. The rate of temperature increase to the calcining temperature is preferably in the range of 50 to 800° C./min, and the retention time at the calcining temperature is preferably within a range of 1 to 120 min. The total thickness of the dielectric thin film 16 formed after calcining is preferably 100 to 600 nm.

Any of the following first to third embodiments of the present invention hereafter is used to form a dielectric thin film 16 having a desired thickness on the lower electrode 14. A first embodiment is a formation method which performs the process from coating to calcining only once. In contrast to the second and third embodiments, this embodiment has the advantage of shortening processing. The second embodiment is a formation method which performs the process from coating to calcining at least twice. In contrast to the first and third embodiments, this embodiment has the advantage of suppressing cracking generated in the surface of the dielectric thin film 16. A third embodiment is a formation method which performs calcining once after performing the process from coating to drying at least twice. In contrast to the first embodiment, this embodiment has the advantage of facilitating formation of a thicker film. Furthermore since calcining at a high temperature is performed only once, a superior effect is obtained in relation to production costs.

In any of the above embodiments, the thickness of the dielectric thin film formed after the initial calcining is within a range of 20 to 600 nm. In this manner, since the thickness of the dielectric thin film 16 formed by the initial calcining step has some degree of thickness, hillock generation can be suppressed by a pressing effect on the lower electrode 14 by the dielectric thin film 16 which is formed from a relatively hard material. When the thickness of the dielectric thin film 16 formed after the initial calcining step is less than 20 nm, a sufficient hillock suppression effect is not obtained. On the other hand, when the upper limiting value is exceeded, a large final thickness is caused in the dielectric thin film 16 and results in deterioration in capacitance and therefore miniaturization or high integration characteristics of the device are not sufficient.

In the first embodiment which performs the process from coating to calcining only once to form the dielectric thin film 16, and the third embodiment which performs calcining once after performing the process from coating to drying at least twice in order to form the dielectric thin film 16, the thickness of the dielectric thin film 16 formed after the initial calcining step is equal to the preferred range for the total thickness of the dielectric thin film 16 above, and it is preferably in a range of 100 to 600 nm. On the other hand, in the second embodiment which performs forming by performing the process from coating to calcining at least twice, when the thickness of the finally obtained dielectric thin film 16 is considered, the thickness of the dielectric thin film 16 formed after the initial calcining step is preferably in a range of 20 to 300 nm.

The ratio of the thickness of the dielectric thin film 16 formed after the initial calcining step to the thickness of the lower electrode 14 (thickness of lower electrode/thickness of dielectric thin film) is preferably in the range of 0.10 to 15.0. When the thickness ratio is within in this range, hillock generation can be sufficiently suppressed by a pressing effect of the dielectric thin film 16 on the lower electrode 14. In the first and the third embodiments which perform calcining only once, the ratio of the thickness of the dielectric thin film 16 formed after the initial calcining step to the thickness of the lower electrode 14 is preferably equal to the ratio of the total thickness of the dielectric thin film 16 and the lower electrode 14 (thickness of lower electrode/thickness of dielectric thin film), and is particularly preferably within a range of 0.50 to 6.0. On the other hand, in the second embodiment in which calcining is performed at least twice, it is particularly preferred to be within 0.50 to 10.0.

After formation of the dielectric thin film 16 above, an upper electrode 17 is formed on the dielectric thin film 16 to thereby obtain a thin film capacitor 10. The upper electrode 17 may preferably use a noble metal material used in the formation of the lower electrode 14 and may be formed using the various methods described above. However in order to obtain preferred surface smoothness after deposition, formation by a sputtering method is preferred.

The thin film capacitor 10 manufacturing using the above process suppresses hillock generation on the lower electrode 14 to preferably 2000 or less per square millimeter, and still more preferably to 500 or less per square millimeter. In this manner, short circuiting between the upper electrode 17 and the lower electrode 14 can be prevented and at the same time, deterioration in leakage current characteristics and dielectric breakdown voltage characteristics can also be prevented. The configuration of the thin film capacitor 10 above mentions the basic structure of a thin film capacitor, but is not limited to the configuration shown in this example.

The thin film capacitor 10 obtained using the method of manufacture according to the present invention mentions superior leakage current characteristics and dielectric breakdown voltage characteristics and is preferably applied to electronic devices including DRAMs, FeRAMs, RF circuits, pyroelectric infrared detection elements, piezoelectric elements, optoelectronic elements, actuators, resonators, ultrasonic wave motors, LC noise filter elements and the like. An electronic device provided with this thin film capacitor 10 has a superior product life.

EXAMPLE

The examples according to the present invention together with the comparative examples will be described in detail below.

Example 1

Firstly as shown in FIG. 1, an insulation film 12 is formed on a substrate 11. More specifically, a $SiO_2$ film having a thickness of 500 nm is formed by thermal processing of a Si substrate having a thickness of 500 μm in an atmosphere of a dried oxidizing gas. Then a metallic Ti film is deposited using a sputtering method on the $SiO_2$ film and subjected to thermal processing for one hour at a temperature of 700° C. to thereby form an adhesion layer 13 having a thickness of 30 nm.

Then Pt is used as a noble metal in a sputtering method to form a lower electrode 14 having a thickness of 100 nm on the adhesion layer 13. The crystal orientation of the lower electrode 14 displays a preferred orientation with respect to the (111) face. Furthermore the average crystal grain size of the lower electrode 14 is adjusted to be 40 nm. In this manner, the supporting body 20 is formed which includes a substrate 11, an insulation film 12 formed on the substrate 11, and a lower electrode 14 formed via an adhesion layer 13 on the insulation film 12.

Then an organic barium compound, an organic strontium compound and a titanium alkoxide are dissolved in an organic solvent so that a molar ratio of Ba:Sr:Ti is 70:30:100 to thereby prepare a thin film formation composition. The thin film formation composition is coated using a spin coating method onto the supporting body obtained above, that is to say, onto the lower electrode 14, without applying an annealing process and dried at a constant temperature of 350° C. for five minutes to thereby form a coating. The substrate 11 having the coating formed thereon is then heated to 700° C. at a temperature increase rate of 60° C./min and maintained at this temperature (calcining temperature) for 5 minutes to thereby form the dielectric thin film 16. The process from coating of the thin film formation composition to calcining is repeated a total of three times including the first time. The coating thickness of the coating after the initial calcining is 50 nm, the thickness of the coating for each calcining step from the second and subsequent calcining steps is 125 nm and thereby obtains a total coating thickness of 300 nm.

Then a Pt upper electrode 17 having a thickness of 100 nm and approximately 250×250 μm square is formed on the resulting dielectric thin film 16 using a metal mask and a sputtering method to thereby obtain a thin film capacitor 10. This thin film capacitor will be called Example 1.

Example 2

A thin film capacitor was obtained which is the same as the Example 1 except that the dielectric thin film is formed on a lower electrode which has a residual stress value as expressed in Table 1 hereafter and has a thickness of 200 nm. This thin film capacitor will be called Example 2.

Example 3

A thin film capacitor was obtained which is the same as the Example 1 except that the dielectric thin film is formed on the lower electrode which has an average crystal grain size and residual stress as expressed in Table 1 hereafter and has a thickness of 300 nm. This thin film capacitor will be called Example 3.

Example 4

A thin film capacitor was obtained which is the same as the Example 1 except that the dielectric thin film is formed on the lower electrode which has an average crystal grain size and residual stress as expressed in Table 1 hereafter and has a thickness of 500 nm. This thin film capacitor will be called Example 4.

Example 5

A thin film capacitor was obtained which is the same as the Example 3 except that a dielectric thin film is formed on the lower electrode which has a residual stress as expressed in Table 1 hereafter and a crystal orientation which has a preferred orientation with respect to the (001) face. This thin film capacitor will be called Example 5.

Example 6

A thin film capacitor was obtained which is the same as the Example 3 except that a dielectric thin film is formed on the lower electrode which has an average crystal grain size and a residual stress as expressed in Table 1 hereafter and a crystal orientation which has a preferred orientation with respect to the (110) face. This thin film capacitor will be called Example 6.

Example 7

A thin film capacitor was obtained which is the same as the Example 3 except that a thickness of the dielectric thin film after the first calcining was 30 nm, and the total thickness is 280 nm. This thin film capacitor will be called Example 7.

Example 8

A thin film capacitor was obtained which is the same as the Example 3 except that the process from coating of the thin film formation composition to calcining is performed once, and the thickness of the dielectric thin film after the first calcining, that is to say, the total thickness was 360 nm. This thin film capacitor will be called Example 8.

Comparative Example 1

A thin film capacitor was obtained which is the same as the Example 3 except that after forming a lower electrode, an annealing process was performed for one hour at 700° C. prior to coating of the thin film formation composition, and a dielectric thin film was formed on the lower electrode which has an average crystal grain size and residual stress as expressed in Table 1 hereafter. This thin film capacitor will be called Comparative Example 1.

Comparative Example 2

A thin film capacitor was obtained which is the same as the Example 3 except that the thickness of the dielectric thin film after the initial calcining is 10 nm, the thickness for each calcining step from the second and subsequent calcining steps is 100 nm which thereby obtains a total thickness of 310 nm, and the process from coating of the thin film formation composition to calcining is repeated a total of four times including the first time. This thin film capacitor will be called Comparative Example 2.

Comparative Example 3

A thin film capacitor was obtained which is the same as the Example 1 except that the thickness of the dielectric thin film after the initial calcining is 6 nm, the thickness for each calcining step from the second and subsequent calcining steps is 100 nm which thereby obtains a total thickness of 306 nm, and the process from coating of the thin film formation composition to calcining is repeated a total of four times including the first time. This thin film capacitor will be called Comparative Example 3.

Comparative Example 4

A thin film capacitor was obtained which is the same as the Example 4 except that the thickness of the dielectric thin film after the initial calcining is 25 nm, the thickness for each calcining step from the second and subsequent calcining steps is 100 nm which thereby obtains a total thickness of 325 nm, and the process from coating of the thin film formation composition to calcining is repeated a total of four times including the first time. This thin film capacitor will be called Comparative Example 4.

[Comparative Tests and Evaluation]

Evaluation with respect to the following criteria was performed on the supporting body or the thin film capacitor obtained in Examples 1 to 8 and Comparative Examples 1 to 4. The results are shown in Table 1 hereafter.

(1) Film thickness and film thickness ratio: the thickness of the lower electrode and the dielectric thin film after initial calcining was measured using a scanning electron microscope (SEM) and these values were used to calculate a ratio for the thickness of the lower electrode and the thickness of the dielectric thin film after initial calcining (thickness of lower electrode/thickness of the dielectric thin film).

(2) Average crystal grain size: The lower electrode was observed using a scanning electron microscope (SEM) and the calculated average value was taken to be an average crystal grain size in the lower electrode.

(3) Crystal orientation: The crystal orientation in the lower electrode was evaluated using X-ray patterns produced by an X-ray diffractometer.

(4) Residual Stress: An isoinclination method using an X-ray diffractometer was employed to calculate residual stress in the lower electrode prior to coating of the thin film formation composition. Physical values for Pt used in the calculation were a Poisson ratio of 0.38 and a Young's modulus of 168000 MPa.

(5) Hillock number: The number of hillocks observed within a range of an arbitrary square having dimensions of 100 μm×100 μm was measured on the surface of the lower electrode using an optical microscope after removal by etching of the upper electrode and the dielectric thin film of the thin film capacitor, and then that figure was converted to a figure per square millimeter.

(6) Leakage current density and dielectric breakdown voltage: A direct-current voltage was applied between the lower electrode and the upper electrode of the thin film capacitor to thereby evaluate I-V characteristics. More specifically, a current-voltage measurement device (Keithley Instruments Inc., Model: 236 SMU) was used to measure a leakage current density with an applied voltage of 5V at a temperature of 23° C. Then using the same device, the voltage was increased in 0.5V units at a temperature of 23° C., and the voltage value before the leakage current density exceeded 1 A/cm$^2$ was taken to be the dielectric breakdown voltage of the thin film capacitor.

ing step was less than 20 nm and the ratio of the thickness of the lower electrode to the thickness of the dielectric thin film after the initial calcining step (thickness of the dielectric thin film/thickness of the dielectric thin film) was more than 15.0, and therefore, when compared to Examples 1 to 8, Comparative Examples 2 to 4 provided an insufficient effect of suppressing hillock generation on the dielectric thin film, generated many hillocks and therefore there was a large adverse effect on the evaluation of leakage current density and dielectric breakdown voltage.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A method for manufacturing a thin film capacitor comprising:
    forming an insulation film (12) on a substrate (11);

TABLE 1

| | Thin Film Capacitor | | | | | | | | | |
|---|---|---|---|---|---|---|---|---|---|---|
| | Pt Lower Electrode | | | | Film Thickness of Dielectric Thin Film [nm] | | | | | |
| | Average | | | | | | | | | |
| | Film Thickness [nm] | Crystal Grain Size [nm] | Crystal Orientation | Film Residual Stress [MPa] | First time | Second and Subsequent times | Total Thickness | Film Thickness Ratio | Hillock Number [no./mm$^2$] | Leakage Current Density [A/cm$^2$] | Dielectric Breakdown Voltage [V] |
| Example 1 | 100 | 40 | (111) | −1320 | 50 | 125 | 300 | 2.0 | 0 | 2.16 × 10$^{-7}$ | 46 |
| Example 2 | 200 | 40 | (111) | −1110 | 50 | 125 | 300 | 4.0 | 200 | 4.21 × 10$^{-7}$ | 35 |
| Example 3 | 300 | 50 | (111) | −950 | 50 | 125 | 300 | 6.0 | 200 | 3.57 × 10$^{-7}$ | 37 |
| Example 4 | 500 | 60 | (111) | −860 | 50 | 125 | 300 | 10.0 | 400 | 5.65 × 10$^{-7}$ | 25 |
| Example 5 | 300 | 50 | (001) | −1020 | 50 | 125 | 300 | 6.0 | 100 | 3.11 × 10$^{-7}$ | 40 |
| Example 6 | 300 | 55 | (110) | −970 | 50 | 125 | 300 | 6.0 | 300 | 4.89 × 10$^{-7}$ | 36 |
| Example 7 | 300 | 50 | (111) | −950 | 30 | 125 | 280 | 10.0 | 200 | 4.84 × 10$^{-7}$ | 40 |
| Example 8 | 300 | 50 | (111) | −950 | 360 | — | 360 | 0.83 | 0 | 5.23 × 10$^{-7}$ | 40 |
| Comparative Example 1 | 300 | 110 | (111) | 770 | 50 | 125 | 300 | 6.0 | 58200 | 9.25 × 10$^{-6}$ | 11 |
| Comparative Example 2 | 300 | 50 | (111) | −950 | 10 | 100 | 310 | 30.0 | 4400 | 2.65 × 10$^{-6}$ | 18 |
| Comparative Example 3 | 100 | 40 | (111) | −1320 | 6 | 100 | 306 | 16.7 | 2800 | 1.67 × 10$^{-6}$ | 18 |
| Comparative Example 4 | 500 | 60 | (111) | −860 | 25 | 100 | 325 | 20.0 | 3500 | 3.63 × 10$^{-6}$ | 19 |

As clearly shown by Table 1, when Examples 1 to 6 and Comparative Examples 1 to 4 are compared, a dielectric thin film having a thickness of 50 nm is obtained by coating the composition and forming after an initial calcining step without application of an annealing process after forming the lower electrode in Examples 1 to 6. In Examples 1 to 6, the number of hillocks generated on the lower electrode is extremely small and therefore a sufficiently superior effect was obtained in the evaluation of leakage current density and dielectric breakdown voltage.

On the other hand, in Comparative Example 1, hillocks are already present in some degree on the lower electrode prior to coating of the composition and therefore there was a large adverse effect on the evaluation of leakage current density and dielectric breakdown voltage.

Furthermore in Comparative Examples 2 to 4, the thickness of the dielectric thin film formed after the initial calcinlaminating an adhesion layer (15) onto the insulation film;
forming a lower electrode (14) on the adhesion layer;
dissolving an organic barium compound, an organic strontium compound and a titanium alkoxide in an organic solvent to achieve a molar ratio of Ba:Sr:Ti=1−x:x:y, coating the resulting thin film formation Ba$_{1-x}$Sr$_x$Ti$_y$O$_3$ composition onto a lower electrode and drying to thereby form a coating;
forming a dielectric thin film (16) by calcining the substrate with the coating formed thereon; and
forming an upper electrode (17) on the dielectric thin film, wherein
the composition is coated onto the lower electrode without performing an annealing process at a temperature higher than 300° C. after forming the lower electrode;
the drying temperature is within a range from ambient temperature to 500° C.;

the calcining temperature is within a range of 500 to 800° C.; and the thickness of the dielectric thin film formed after the first calcining is 20 to 600 nm.

2. The method for manufacturing a thin film capacitor according to claim 1, wherein the process from coating to calcining is performed at least once.

3. The method for manufacturing a thin film capacitor according to claim 1, wherein the process from coating to drying is performed at least twice and then calcining is performed once.

4. The method for manufacturing a thin film capacitor according to claim 1, wherein the ratio between the thickness of the lower electrode and the thickness of the dielectric thin film formed after the initial calcining step (thickness of lower electrode/thickness of the dielectric thin film) is in the range 0.10 to 15.0.

5. The method for manufacturing a thin film capacitor according to claim 1, wherein the ratio between the thickness of the lower electrode and the thickness of the dielectric thin film formed after the initial calcining step (thickness of lower electrode/thickness of the dielectric thin film) is in the range 0.50 to 6.0.

6. The method for manufacturing a thin film capacitor according to claim 1, wherein a pressing effect is provided on the lower electrode by the thickness of the dielectric thin film formed after the first calcining.

\* \* \* \* \*

UNITED STATES PATENT AND TRADEMARK OFFICE
CERTIFICATE OF CORRECTION

PATENT NO. : 8,501,560 B2  
APPLICATION NO. : 13/067800  
DATED : August 6, 2013  
INVENTOR(S) : Hideaki Sakurai et al.

Page 1 of 1

It is certified that error appears in the above-identified patent and that said Letters Patent is hereby corrected as shown below:

On the Title Page, Item (73)

Assignees should read: ~~Mitubishi~~ Mitsubishi Materials Corporation, Tokyo (JP); STMicroelectronics(Tours) SAS, Tours (FR)

Signed and Sealed this
Eleventh Day of March, 2014

Michelle K. Lee
*Deputy Director of the United States Patent and Trademark Office*